US009997375B2

(12) United States Patent
Serita et al.

(10) Patent No.: US 9,997,375 B2
(45) Date of Patent: Jun. 12, 2018

(54) LED UNIT AND MANUFACTURING METHOD THEREOF

(71) Applicant: KOITO MANUFACTURING CO., LTD., Minato-ku, Tokyo (JP)

(72) Inventors: Takuya Serita, Shizuoka (JP); Atsushi Ozawa, Shizuoka (JP)

(73) Assignee: KOITO MANUFACTURING CO., LTD., Minato-ku, Tokyo (JP)

( * ) Notice: Subject to any disclaimer, the term of this patent is extended or adjusted under 35 U.S.C. 154(b) by 0 days. days.

(21) Appl. No.: 14/706,292

(22) Filed: May 7, 2015

(65) Prior Publication Data
US 2015/0325740 A1 Nov. 12, 2015

(30) Foreign Application Priority Data
May 9, 2014 (JP) .................................. 2014-097794

(51) Int. Cl.
*H01L 33/62* (2010.01)
*H01L 21/48* (2006.01)
(Continued)

(52) U.S. Cl.
CPC ............ *H01L 21/48* (2013.01); *F21S 41/192* (2018.01); *F21S 43/14* (2018.01); *F21S 43/145* (2018.01);
(Continued)

(58) Field of Classification Search
CPC .. H01L 33/62; H01L 33/60; H01L 2933/0066
See application file for complete search history.

(56) References Cited

U.S. PATENT DOCUMENTS 7,701,144 B2 * 4/2010 Tsukamoto .......... B60Q 1/0094
315/32
2006/0043401 A1 * 3/2006 Lee ...................... H01L 33/647
257/99
(Continued)

FOREIGN PATENT DOCUMENTS

CN          101153693 A     4/2008
EP            2194311 A2     6/2010
(Continued)

OTHER PUBLICATIONS

Office Action dated Apr. 27, 2017 by the State Intellectual Property Office of P.R. China in counterpart Chinese Patent Application No. 201510231184.7.
(Continued)

*Primary Examiner* — Daniel Luke
*Assistant Examiner* — Khatib Rahman
(74) *Attorney, Agent, or Firm* — Sughrue Mion, PLLC

(57) ABSTRACT

An LED unit according to the invention has a resin housing which is detachably assembled to a vehicle lamp, a lead frame which has a terminal portion which is connected to an exterior terminal, an LED mounting portion and a control part mounting portion and lead frame which is provided integrally on the housing, an LED which is mounted on the LED mounting portion, and a control part which is mounted on the control part mounting portion for controlling the illumination of the LED. The lead frame has a support resin which is a resin material which holds the LED mounting portion in such a way as to surround the LED mounting portion. The lead frame is bent to a back side of the LED at areas outside the support resin, and the control part mounting portion and the terminal portion are formed respectively by the bent portions.

12 Claims, 24 Drawing Sheets

(51) Int. Cl.
*H01L 33/00* (2010.01)
*H01L 33/60* (2010.01)
*F21K 9/90* (2016.01)
*H05K 3/20* (2006.01)
*F21Y 115/10* (2016.01)

(52) U.S. Cl.
CPC ............ *F21S 43/195* (2018.01); *F21S 45/47* (2018.01); *H01L 33/005* (2013.01); *H01L 33/60* (2013.01); *H01L 33/62* (2013.01); *F21K 9/90* (2013.01); *F21Y 2115/10* (2016.08); *H01L 2224/48247* (2013.01); *H01L 2224/49113* (2013.01); *H01L 2933/0066* (2013.01); *H05K 3/202* (2013.01); *H05K 2201/10106* (2013.01)

(56) References Cited

U.S. PATENT DOCUMENTS

| | | |
|---|---|---|
| 2007/0030688 A1 | 2/2007 | Amano et al. |
| 2008/0079019 A1 | 4/2008 | Huang et al. |
| 2008/0129204 A1 | 6/2008 | Tsukamoto et al. |
| 2009/0213587 A1* | 8/2009 | Enomoto ............. F21S 48/238 362/235 |
| 2012/0051017 A1 | 3/2012 | Lee et al. |
| 2012/0094537 A1* | 4/2012 | Aoki .................... H01R 13/688 439/620.26 |
| 2013/0250601 A1* | 9/2013 | Ito ........................ B60Q 1/0064 362/544 |
| 2015/0003085 A1* | 1/2015 | Yamasaki .............. B60Q 1/068 362/465 |

FOREIGN PATENT DOCUMENTS

| | | |
|---|---|---|
| JP | 58-2079 A | 1/1983 |
| JP | 2003-273404 A | 9/2003 |
| JP | 2009-32763 A | 2/2009 |
| JP | 2010-135198 A | 6/2010 |
| JP | 2012-49527 A | 3/2012 |
| JP | 2012-116266 A | 6/2012 |
| JP | 2013-200973 A | 10/2013 |
| JP | 2013-243313 A | 12/2013 |

OTHER PUBLICATIONS

Communication issued by the Japanese Patent Office dated Jan. 25, 2018 in counterpart Japanese Patent Application No. 2014-097794.

* cited by examiner

LED UNIT AND MANUFACTURING METHOD THEREOF

CROSS-REFERENCE TO RELATED APPLICATION

The present application claims the benefit of priority of Japanese Patent Applications No. 2014-097794, filed on May 9, 2014, which is incorporated herein by reference.

TECHNICAL FIELD

The present invention relates to an LED unit and a manufacturing method thereof.

BACKGROUND ART

In recent years, LEDs have been adopted for vehicle lamps, promoting the reduction in size of light sources. For example, in some of those vehicle lamps, a tail lamp and a stop lamp are disposed close to each other so as to share a single LED light source unit and a common inner lens to which light from the light source unit is collected, enhancing the decorative features of the lamp. In fabricating an LED unit like the one described above, an LED and its control part are mounted on a lead frame made of a metallic board, and the lead frame is then assembled to a housing (for example, refer to JP-A-2013-200973).

In an LED unit described in JP-A-2013-200973, LEDs are mounted on one side of a lead frame. The lead frame is then bent at edge portions on an opposite side thereof to the side where the LEDs are mounted and is assembled to a housing. This enables the LEDs to be held stably, and the bent portions can be made to function as a heat sink.

However, in fabricating an LED unit like the one described above, as a matter of convenience in the process of manufacturing, the lead frame is bent after the LEDs have been mounted thereon. In the bending step, a deflection is produced in the lead frame, and the deflection produces, in turn, a local load in the portion where the LEDs are mounted. Thus, there are fears that fracture or separation is produced in the portion where the LEDs are mounted.

SUMMARY OF THE INVENTION

The invention has been made in view of these situations, and an object thereof is to provide a method for preventing effectively the production of fracture or the like in a portion of a lead frame where LEDs are mounted in a lead frame bending step.

According to an aspect of the invention, there is provided a manufacturing method of an LED unit which is made by assembling an LED and a control part for controlling the illumination of the LED integrally on a housing made of resin. This manufacturing method includes a lead frame forming step of forming a lead frame where a terminal forming area where a terminal portion is formed for connection with an exterior terminal, an LED mounting area where an LED is to be mounted and a control part mounting area where a control part is to be mounted are connected together by working a metallic plate, a support resin placing step of placing a support resin on the lead frame, the support resin being a resin material which holds the LED mounting area in such a way as to surround the LED mounting area, an LED mounting step of mounting an LED on the LED mounting area, a control part mounting step of mounting a control part on the control part mounting area, a bending step of bending the lead frame to a back side thereof at areas outside the support resin, and an assembling step of assembling the lead frame so bent to a housing.

According to this aspect of the invention, the support resin is placed on the LED mounting area in such a way as to surround the area before the lead frame is bent. Then, the lead frame is bent at the area outside the support resin. Namely, the LED mounting area of the lead frame is supported rigidly inwards of the support resin, while the bent portion resides outside the support resin. Therefore, it is difficult for a load applied to the lead frame in the bending step to be transmitted to the LED mounting portion. This makes it possible to prevent effectively the projection of fracture or the like in the LED mounting portion in the bending step of bending the lead frame.

Specifically, the LED mounting step may be executed after the support resin placing step. It is preferable to execute an LED sealing step of filling a sealing resin inwards of the support resin so as to cover the LED after the LED mounting step.

According to this aspect, the LED is mounted in which a state that the LED mounting area is supported by the support resin, and this enables the LED to be mounted in a stable fashion. Additionally, the support resin placing step is executed before the LED mounting step, and therefore, no load is applied to the LED when placing the support resin. Further, the support resin can function as a drip tray for the sealing resin, leading to a merit that there is produced no waste in construction.

The control part mounting step includes a paste mounting step of mounting a metal paste on the control part mounting area, a part mounting step of mounting a control part on the metal paste, and a reflow step of melting the metal paste to join the control part to the control part mounting area by a reflow technique.

According to this aspect, the control part is mounted on the lead frame which is in a deployed state before bending, this enabling the manufacturing process to advance efficiently along the fabrication line. A solder paste or other paste of a brazing material can be adopted as the metal paste. The joining of the control part using the reflow technique should be executed prior to the LED mounting step. This can protect the LED which is damaged relatively easily by heat.

In the assembling step, the lead frame which is bent and the housing may be formed integrally by an insert molding of a resin material which is a material for the housing. According to this aspect, the lead frame adheres closely to the housing, and therefore, heat generated in the LED and the control part is transmitted easily to the housing by way of the lead frame. This can obtain a high heat dissipating effect.

In the support resin placing step, the lead frame and the support resin may be formed integrally by an insert molding of a resin material which is a material for the resin support. According to this aspect, the support resin can be placed efficiently by the partial insert molding which is carried out in such a state that the lead frame in the deployed state prior to bending. Alternatively, a support resin which is prepared separately from the lead frame may be assembled to the lead frame. However, it is preferable to adopt the insert molding from the viewpoint of fabrication efficiency and working properties.

According to another aspect of the invention, there is provided an LED unit which functions as a light source of a vehicle lamp. This LED unit includes a resin housing which is detachably assembled to a vehicle lamp, a lead frame which has a terminal portion which is connected to an exterior terminal, an LED mounting portion and a control part mounting portion and which is provided integrally on the housing, an LED which is mounted on the LED mounting portion, and a control part which is mounted on the control part mounting portion for controlling the illumination of the LED. The lead frame has a support resin which is a resin material which holds the LED mounting portion in such a way as to surround the LED mounting portion. The lead frame is bent to a back side of the LED at an area outside the support resin, and the control part mounting portion and the terminal portion are formed by the bent portions.

According to this aspect, the support resin is placed so as to surround the LED mounting area on the lead frame, and therefore, it is difficult for a load to be applied to the LED mounting portion when the lead frame is bent in the manufacturing process of the LED unit. This can prevent the occurrence of rapture or the like in the LED mounting portion effectively.

It is noted that arbitrary combinations of the constituent elements described above and substitutions of expressions between the method, unit, system and the like of the invention are also effective as aspects of the invention.

According to the invention, it is possible to prevent the occurrence of rapture or the like in the LED mounting portion effectively in the bending step of bending the lead frame.

DETAILED DESCRIPTION

Figure 1:
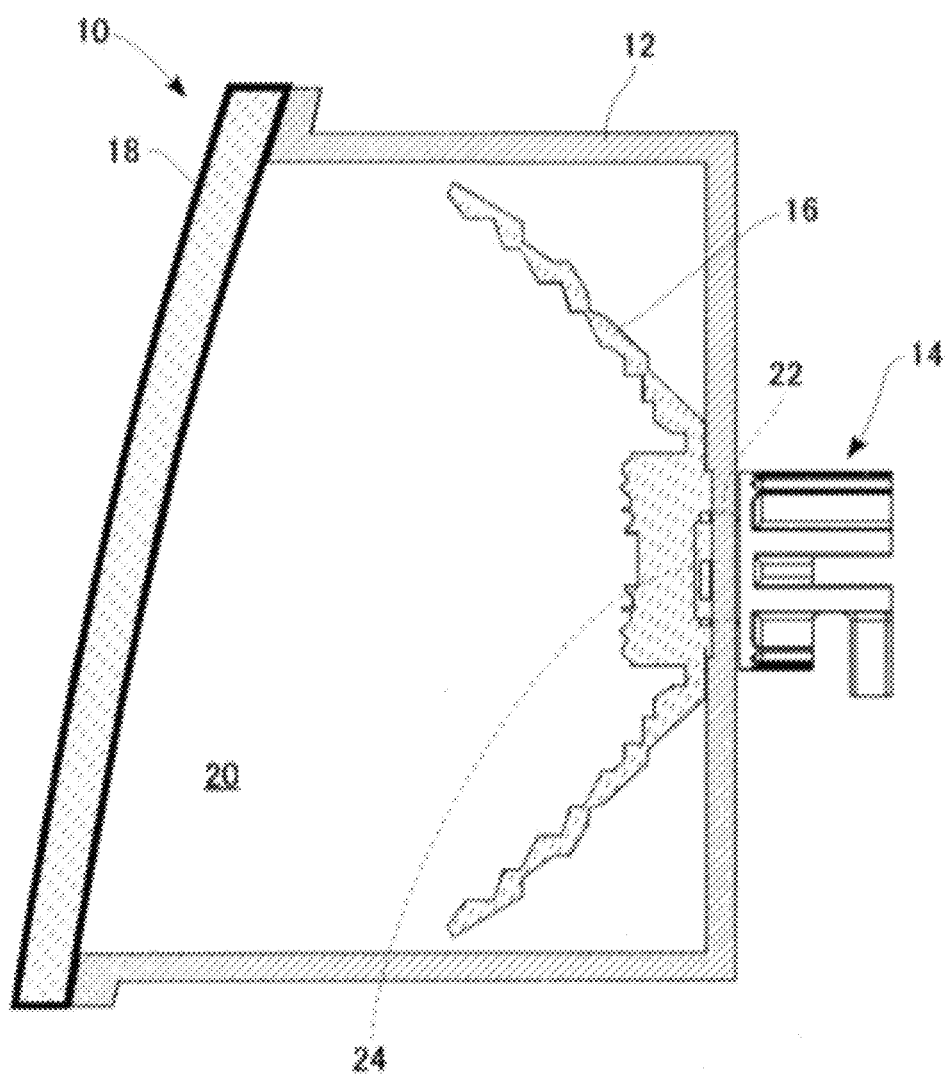
FIG. 1 is a vertical sectional view showing a schematic configuration of a vehicle lamp according to an embodiment of the invention.

Hereinafter, referring to the drawings, an embodiment of the invention will be described in detail. In the drawings, like reference numerals will be given to like or similar constituent elements so that the description of those like or similar constituent elements will be omitted as required. In the following description, as a matter of convenience, vertical and longitudinal positional relationships will be expressed based on such a state that the vehicle lamp is mounted on a vehicle on some occasions.

FIG. 1 is a vertical sectional view showing a schematic configuration of a vehicle lamp according to an embodiment of the invention. A vehicle lamp 10 makes up a tail and stop combination lamp and is made by assembling an LED unit 14, an inner lens 16 and an outer lens 18 to a lamp body 12. A lamp compartment 20 is defined between the lamp body 12 and the outer lens 18. The LED unit 14 is attached to the lamp body 12 via a fitting hole 22 which is formed in a center of the lamp body 12. A plurality of LEDs 24 are mounted on a front surface of the LED unit 14 as a light source and are exposed to an interior of the lamp compartment 20 when the LED unit 14 is so attached to the lamp body 12. The inner lens 16 is attached to the lamp body 12 so as to cover the plurality of LEDs 24 from the lamp compartment 20 side. The inner lens 16 transmits or diffuses (surface emits) light emitted from the plurality of LEDs 24.

Figure 2A:
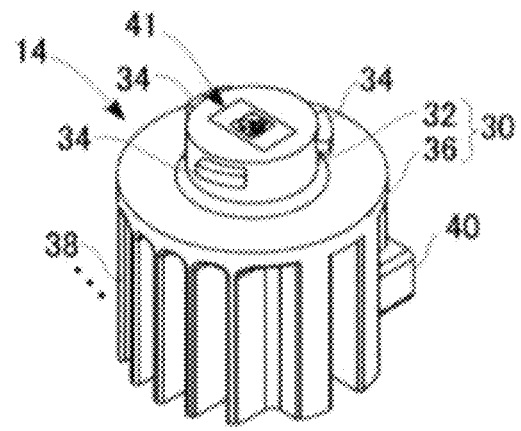
FIG. 2A is a perspective view of an LED unit.
Figure 2B:
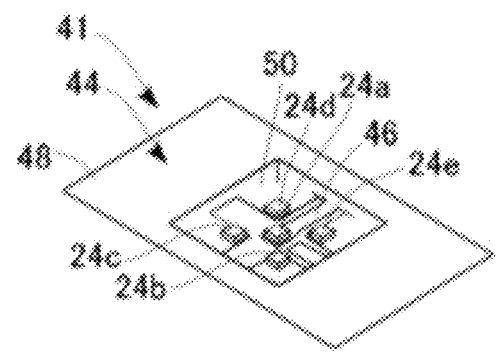
FIG. 2B is a partial enlarged view of the vicinity of an LED unit.
Figure 2C:
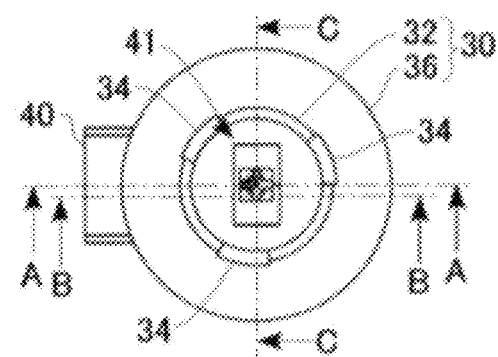
FIG. 2C is a front view of an LED unit.
Figure 2D:
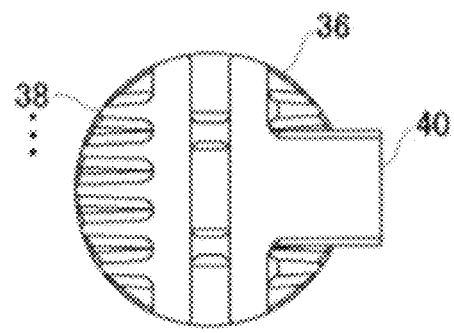
FIG. 2D is a rear view of an LED unit.
Figure 2E:
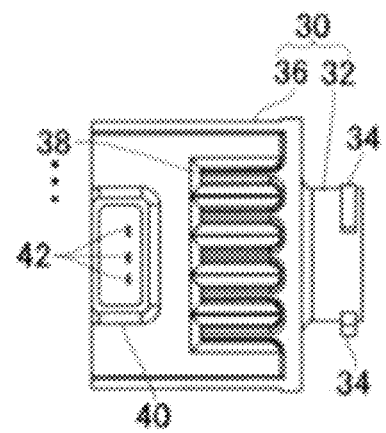
FIG. 2E is a left side view of an LED unit.
Figure 2F:
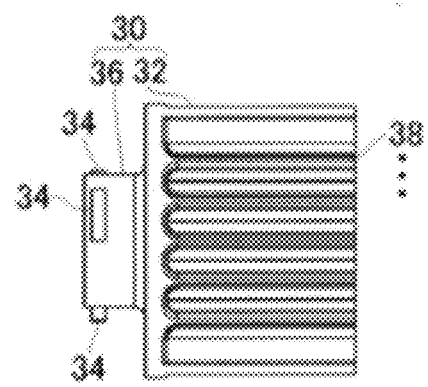
FIG. 2F is a right side view of an LED unit.
Figure 2G:
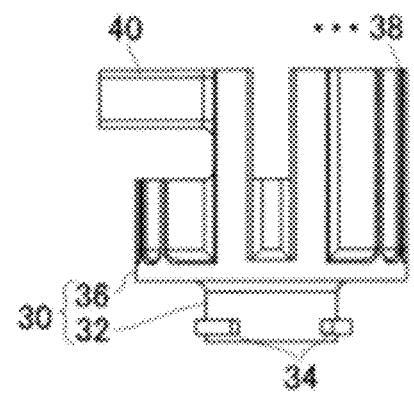
FIG. 2G is a plan view of an LED unit.
Figure 2H:
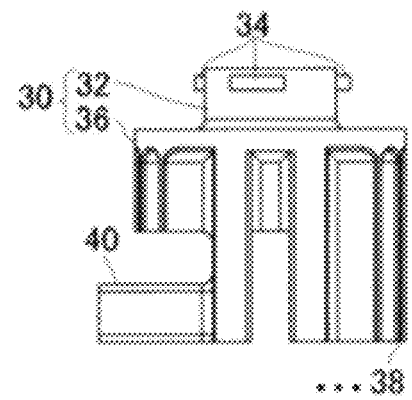
FIG. 2H is a bottom view of an LED unit.
Figure 3A:
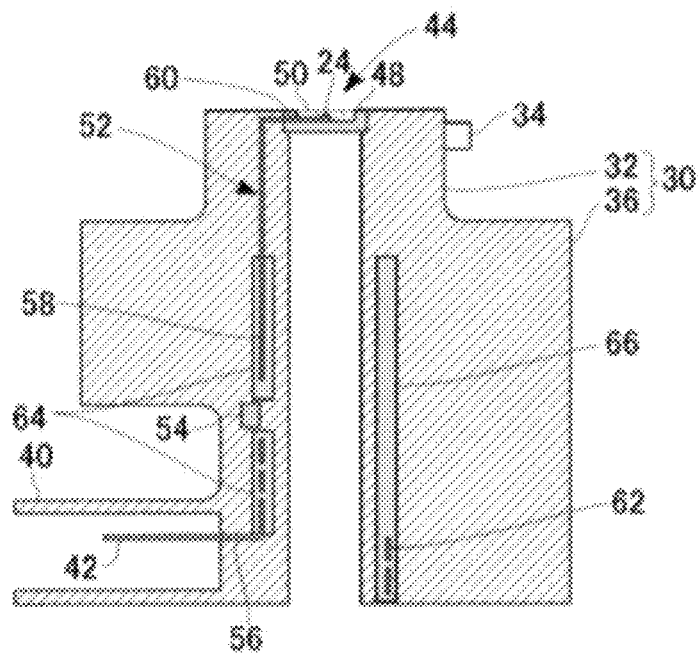
FIG. 3A is a sectional view taken along a line A-A in FIG. 2C of the LED unit.

FIGS. 2A to 2H show views showing external appearances of the LED unit 14. FIG. 2A is a perspective view, and FIG. 2B is a partial enlarged view showing the vicinity of the LEDs. FIG. 2C is a front view and FIG. 2D is a rear view of the LED unit 14. FIG. 2E is a left side view and FIG. 2F is a right side view of the LED unit 14. FIG. 2G is a plan view and FIG. 2H is a bottom view of the LED unit 14. FIG. 3 shows sectional views of the LED unit 14. FIG. 3A is a sectional view taken along a line A-A in FIG. 2C, FIG. 3B is a sectional view taken along a line B-B in FIG. 2C, FIG. 3C is a sectional view taken along a line C-C in FIG. 2C, and FIG. 3D is an enlarged view of a portion A shown in FIG. 3C.

As shown in FIGS. 2A and 2C to 2H, the LED unit 14 has a resin housing 30 having a stepped cylindrical shape. An end portion of the housing 30 constitutes a small-diameter portion 32, and three fitting portions 34 are provided on an outer circumferential surface of the small-diameter portion 32 at equal intervals so as to project therefrom. These fitting portions 34 are fitted on the lamp body 12 through the fitting hole 22, whereby the LED lamp unit 14 is detachably assembled to the lamp body 12. A heat dissipating construction is provided on a large-diameter portion 36 of the housing 30, and the heat dissipating construction includes a plurality of ribs 38 which are aligned parallel to an axis of the housing 30. A connector 40 is provided at an opposite end portion of the large-diameter portion 36 to an end portion thereof where the small-diameter portion 32 is provided, and this connector 40 extends radially outwards from the large-diameter portion 36. A light source mounting portion 41 is provided at the center of a distal end face of the small-diameter portion 32. As shown in FIG. 2E, a plurality of terminals 42, configured to supply electric power to the LEDs 24, are exposed inside the connector 40.

As shown in FIG. 2B, the light source mounting portion 41 includes the plurality of LEDs 24 and a support member 44 which supports the LEDs 24. The support member 44 includes an LED mounting portion 46 where the plurality of LEDs 24 are mounted, a support resin 48 which supports the LED mounting portion 46 so as to surround the LED mounting portion 46, and a transparent sealing resin 50 which is filled inwards of the support resin 48 to project the LEDs 24. In the plurality of LEDs 24, a central LED 24a functions as a light source for a tail lamp, and four LEDs 24b to 24e which surrounds the central LED 24a function as light sources for a stop lamp.

Figure 3B:
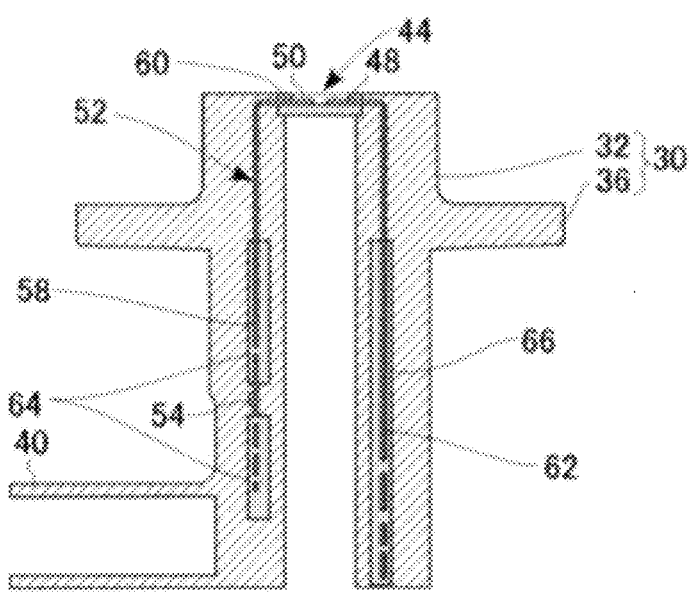
FIG. 3B is a sectional view taken along a line B-B in FIG. 2C of the LED unit.
Figure 3C:
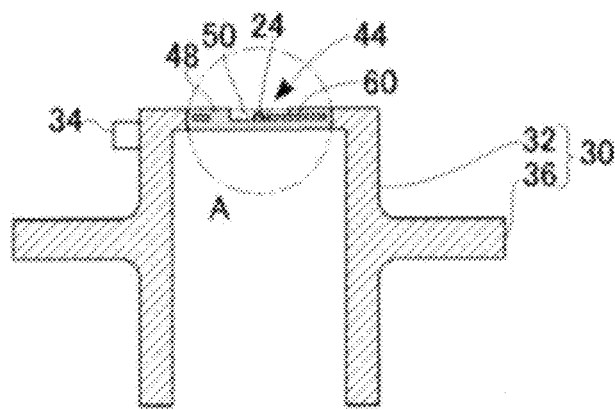
FIG. 3C is a sectional view taken along a line C-C in FIG. 2C of the LED unit.
Figure 3D:
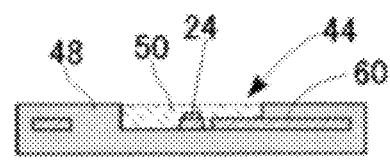
FIG. 3D is an enlarged view of a portion A shown in FIG. 3C.

As shown in FIGS. 3A and 3B, a lead frame 52 having a U-shape cross-sectional shape is embedded in the housing 30. The lead frame 52 functions as a board on which the LEDs 24 and control parts 54 are mounted. In the lead frame 52, a terminal portion 56, a first control part mounting portion 58, an LED mounting portion 60 and a second control part mounting portion 62 are provided integrally in a longitudinal direction. The plurality of LEDs 24 are mounted on one side of the LED mounting portion 60.

The lead frame 52 is formed into the U-shape by being bent to a back side of the LEDs 24 at right angles outside the LED mounting portion 60. One of the bent portions form the first control part mounting portion 58 and the terminal portion 56, while the other bent portion forms the second control part mounting portion 62. The lead frame 52 is bent further at right angles to the first control part mounting portion 58 at the terminal portion 56. This causes the plurality of terminals 42 to be exposed to an exterior of the connector 40 inside the connector 40. The lead frame 52 has the support resin 48 which supports the LED mounting portion 60, a support resin 64 which supports the first control part mounting portion 58, and a support resin 66 which supports the second control part mounting portion 62, and these resins are embedded in the housing 30.

As shown in FIGS. 3C and 3D, the one side of the LED mounting portion 60 where the LEDs 24 are mounted is exposed from the housing 30 at the support resin 48 so that light emitted from the LEDs 24 is visible through the sealing resin 50.

Figure 4:
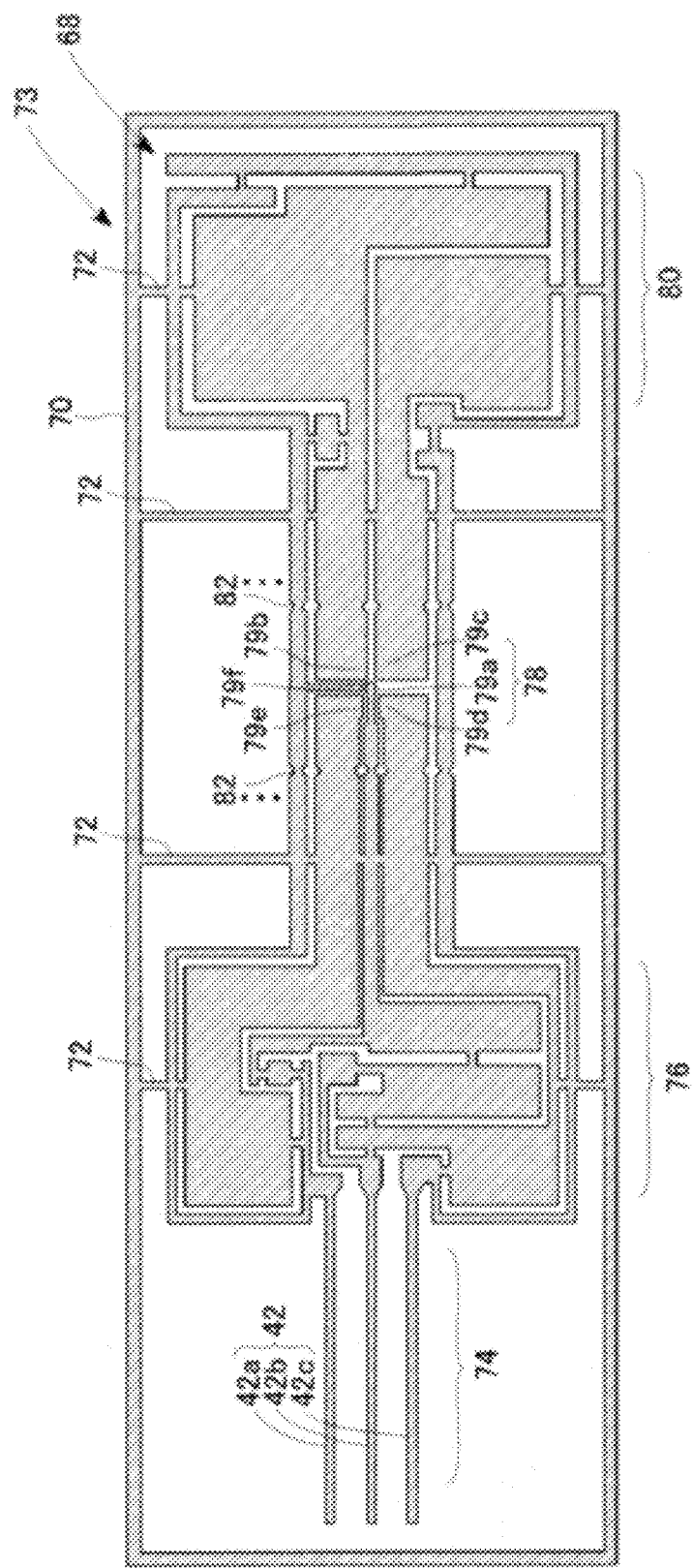
FIG. 4 is a view showing a manufacturing step of the LED unit.
Figure 5:
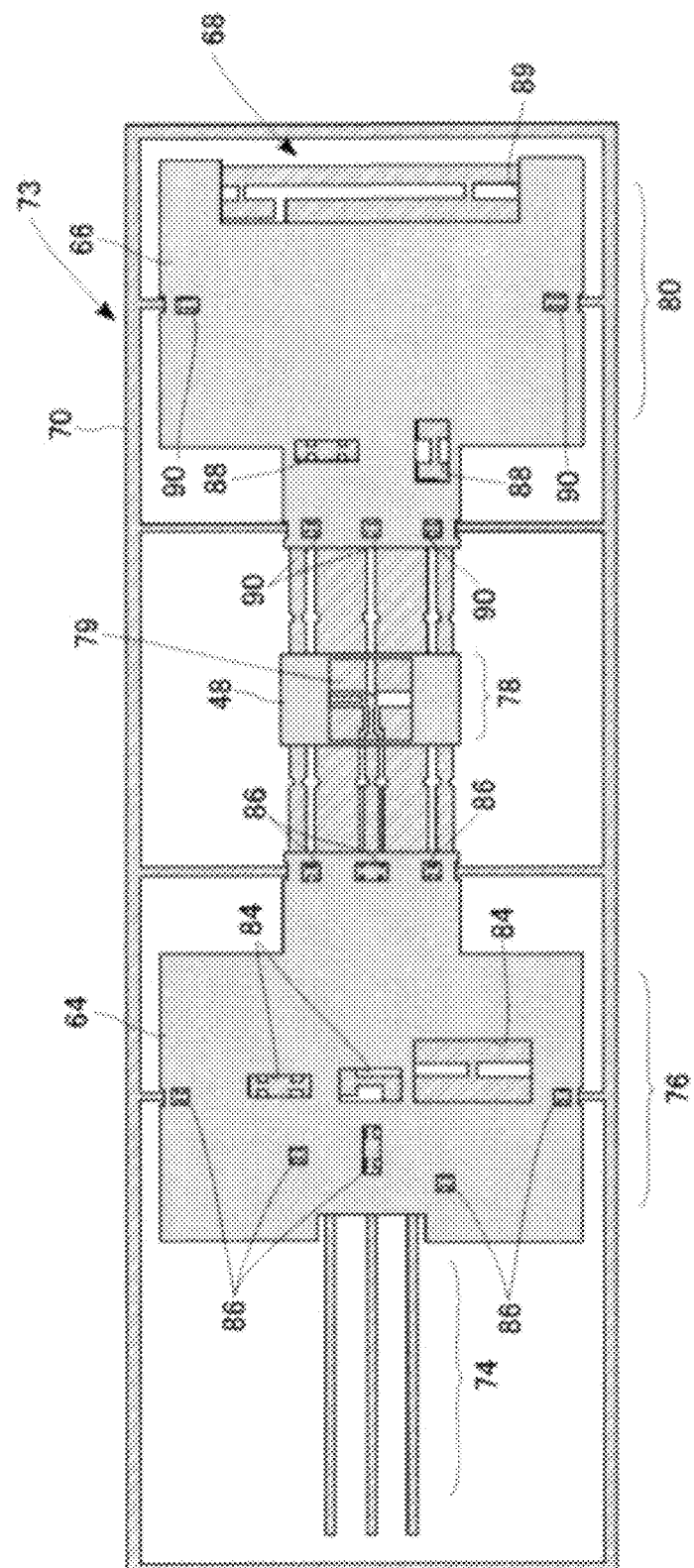
FIG. 5 is a view showing another manufacturing step of the LED unit.
Figure 6:
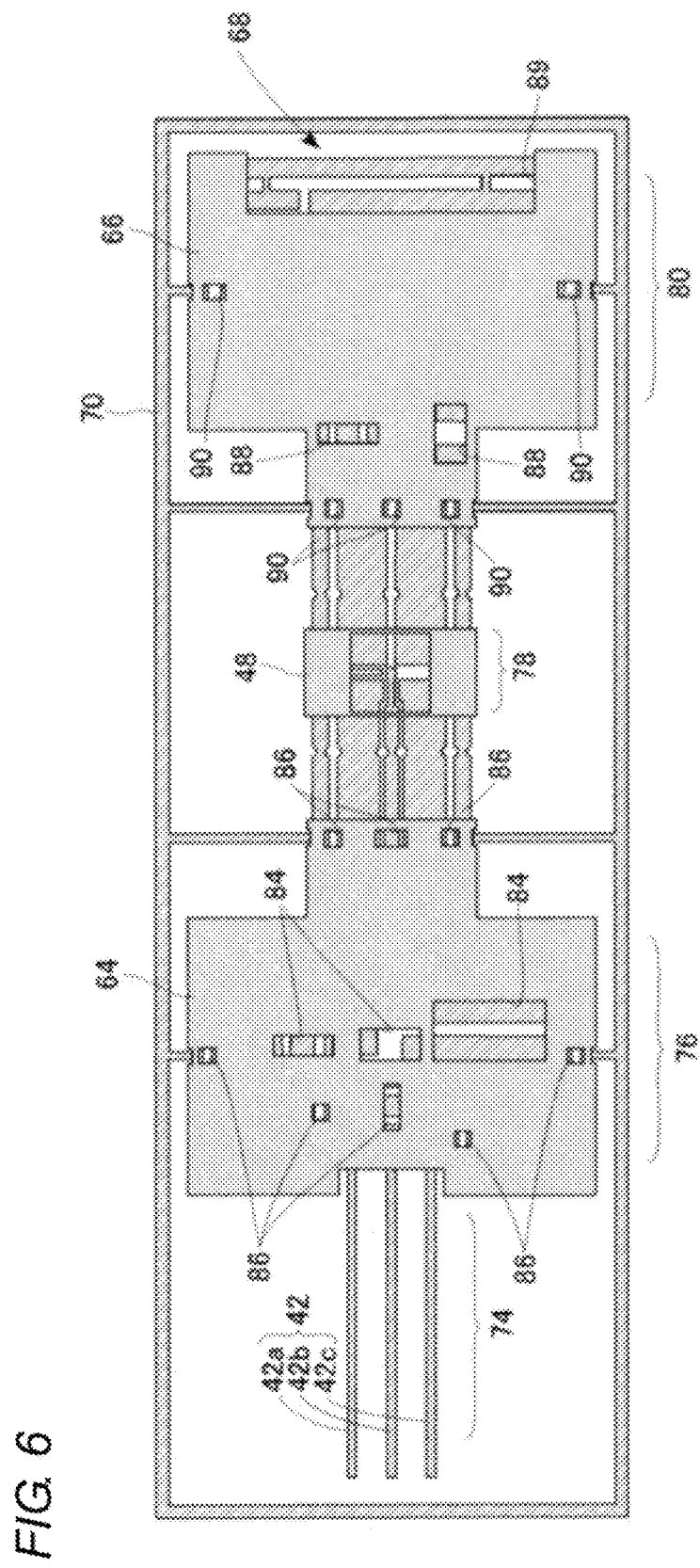
FIG. 6 is a view showing a further manufacturing step of the LED unit.
Figure 7:
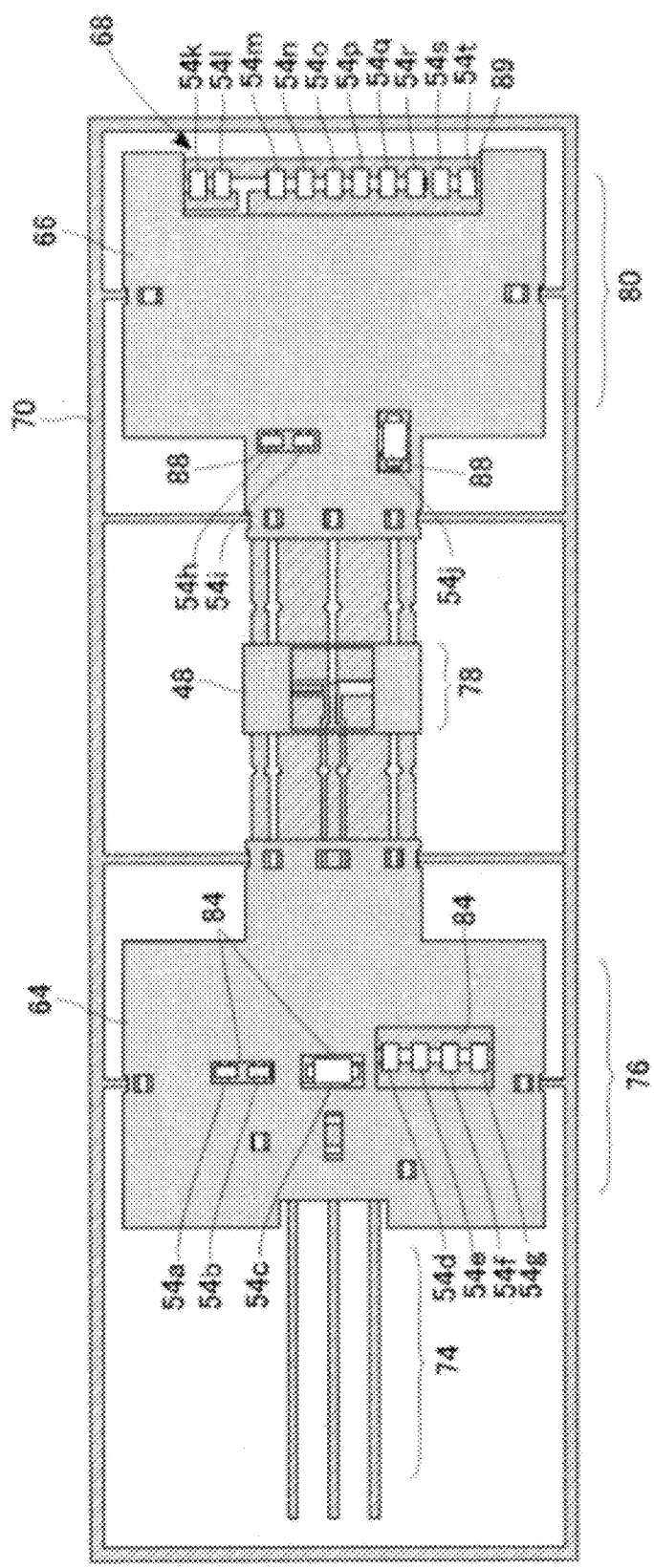
FIG. 7 is a view showing a manufacturing step of the LED unit.
Figure 8:
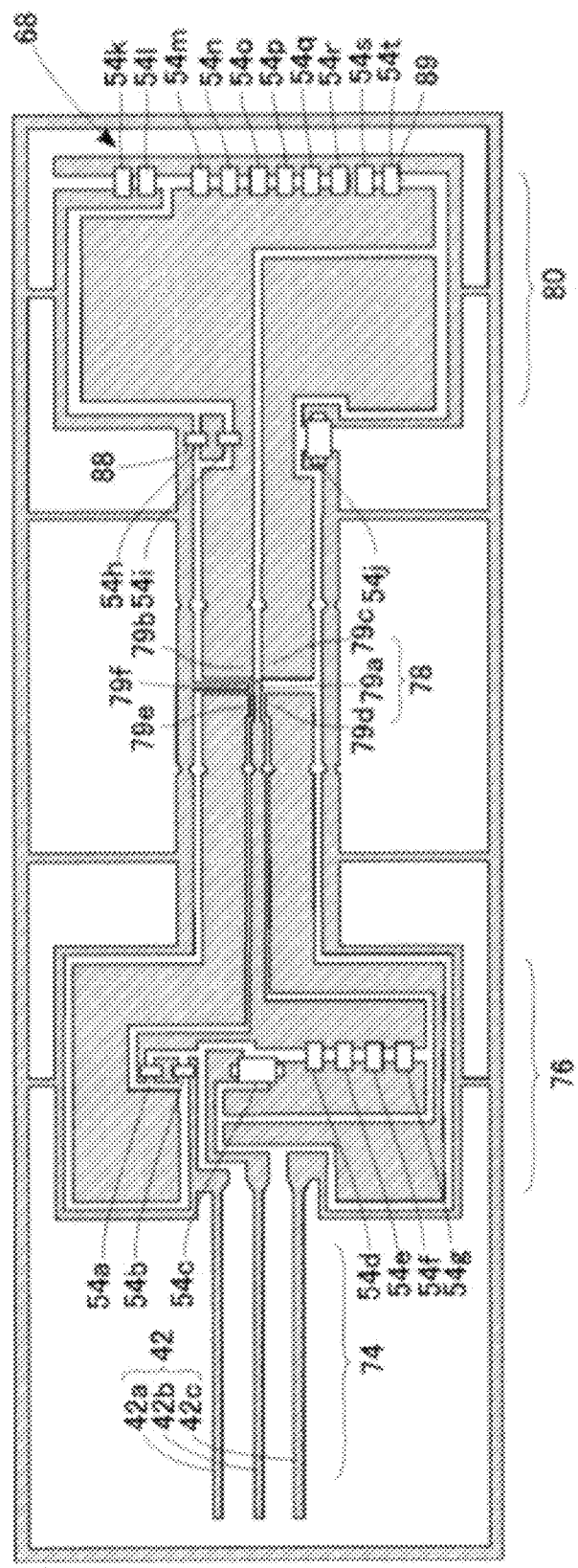
FIG. 8 is a view showing another manufacturing step of the LED unit.
Figure 9:
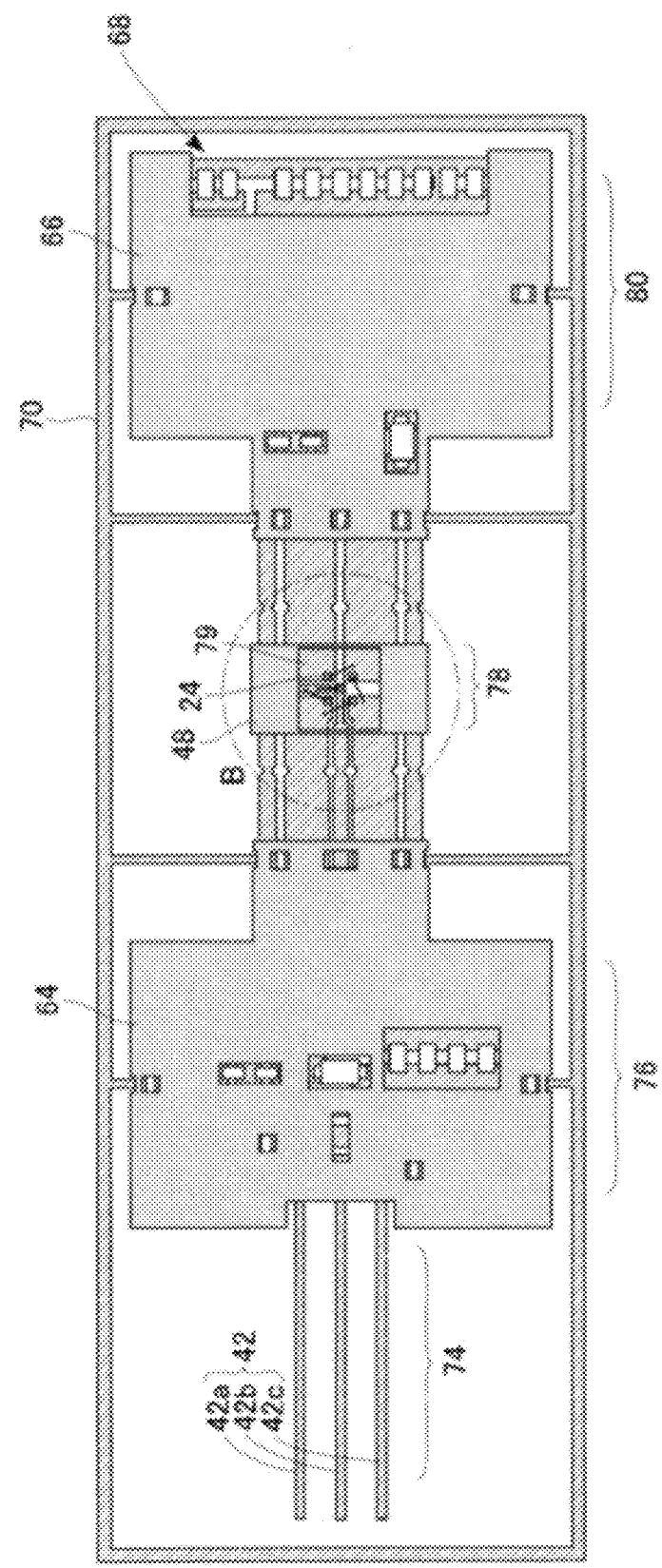
FIG. 9 is a view showing a further manufacturing step of the LED unit.
Figure 10A:
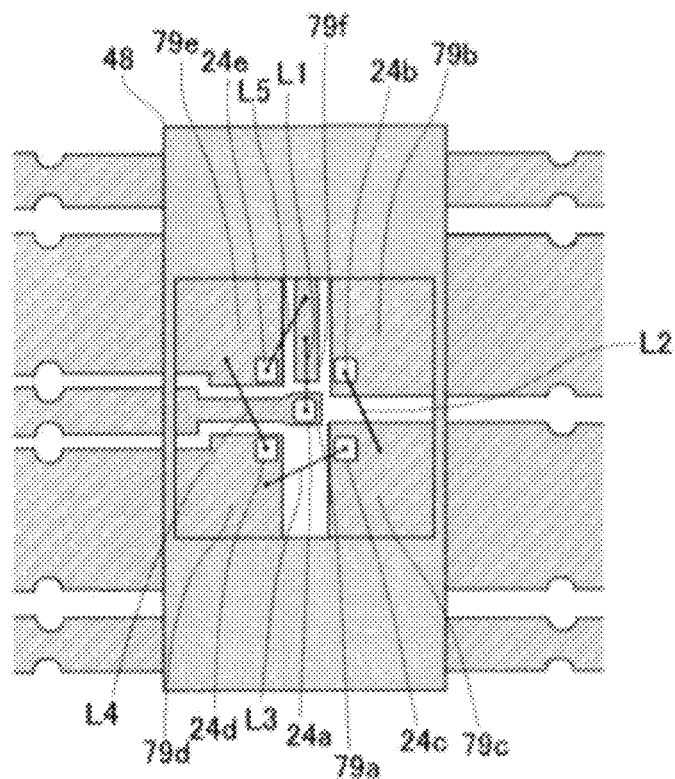
FIGS. 10A and 10B are views showing manufacturing steps of the LED unit.
Figure 10B:
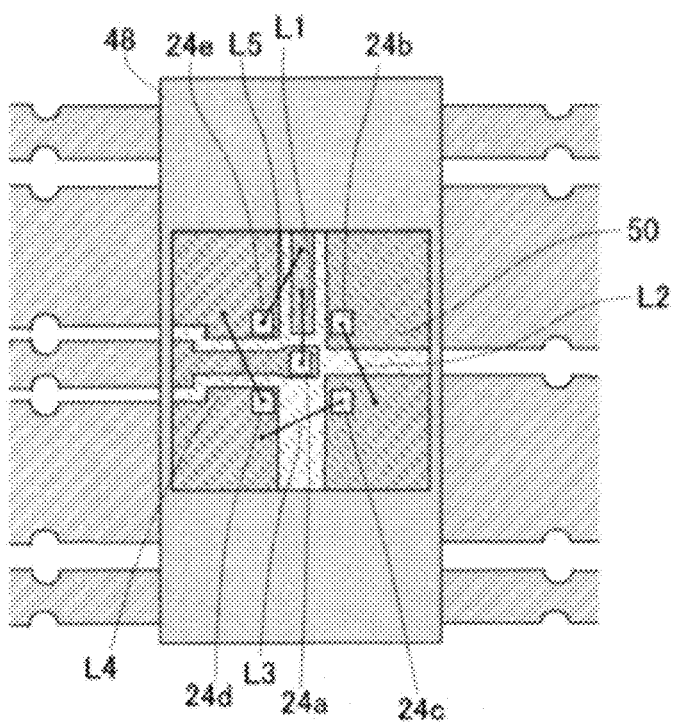
Figure 11:
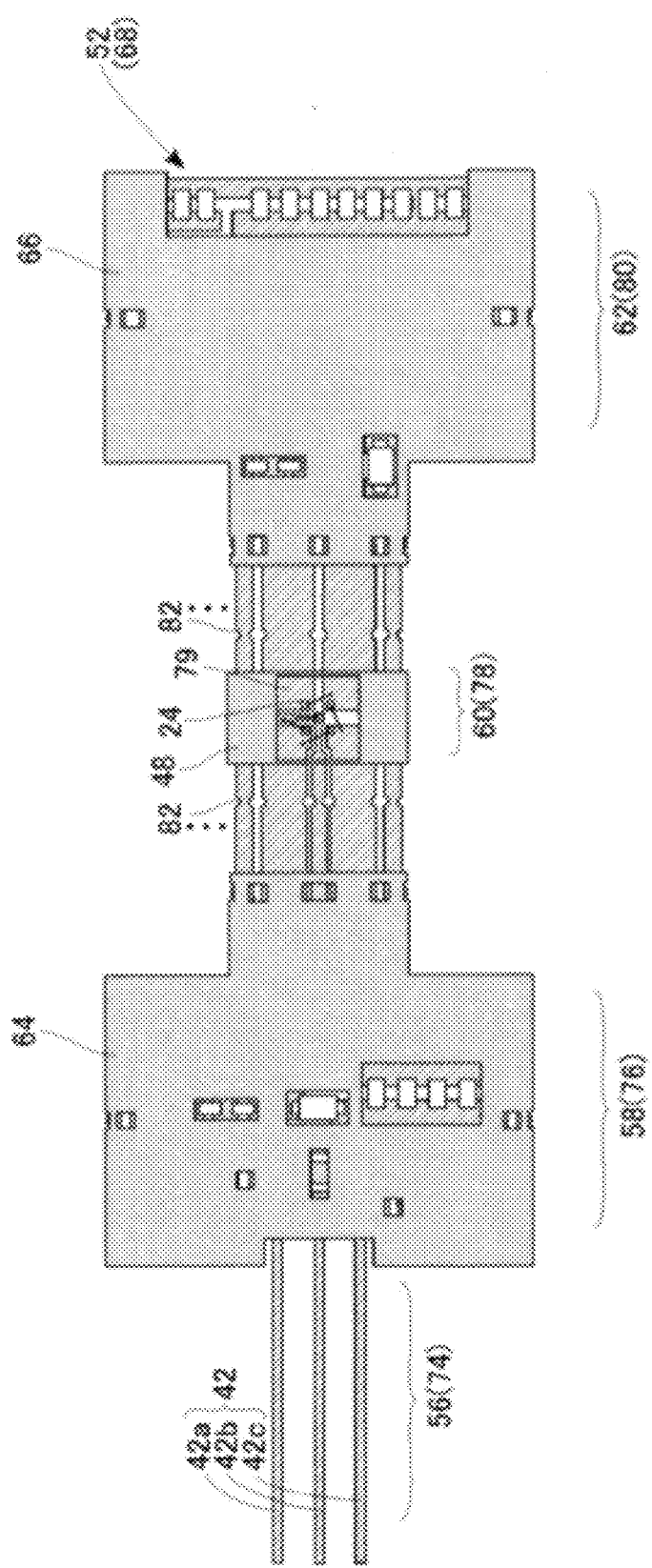
FIG. 11 is a view showing another manufacturing step of the LED unit.
Figure 12A:
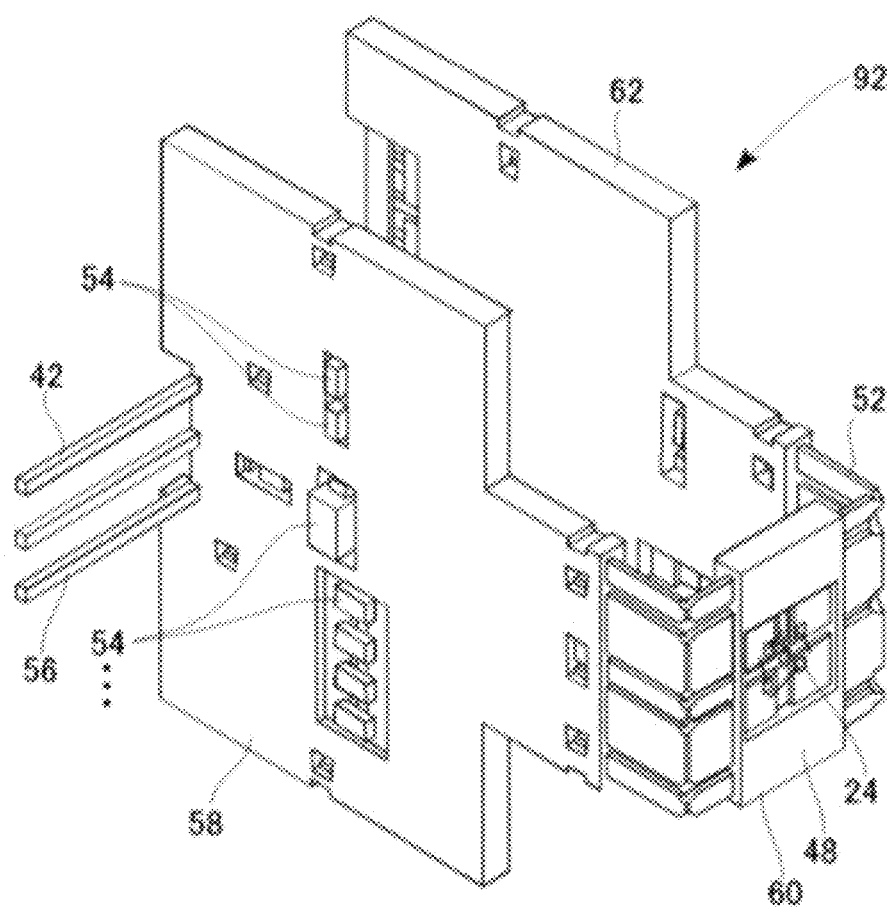
FIGS. 12A and 12B are views showing a further manufacturing step of the LED unit.
Figure 12B:
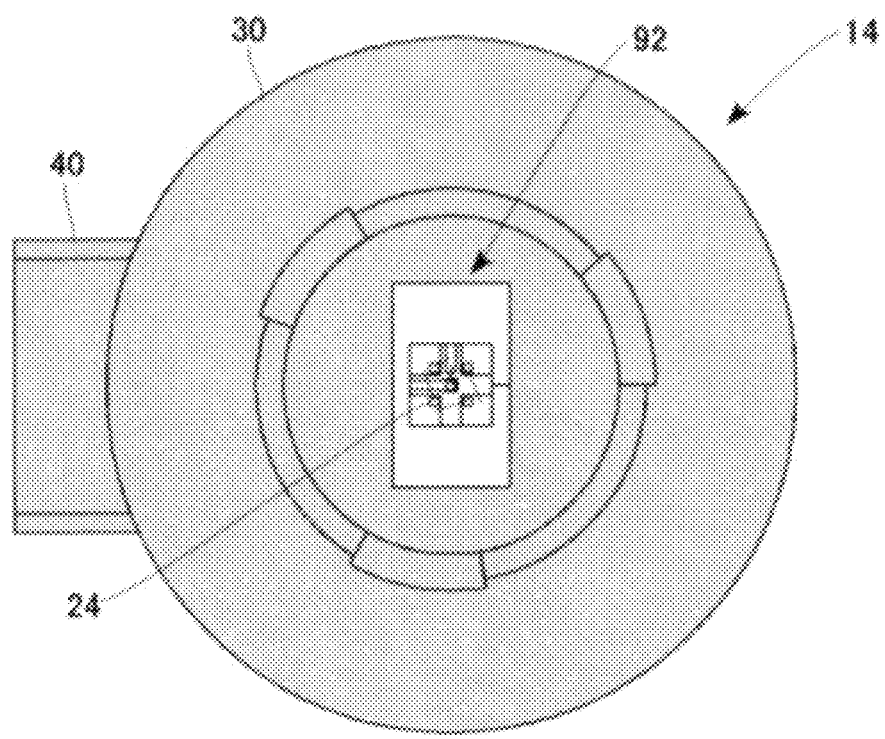

Next, a manufacturing method of the LED unit 14 will be described. FIGS. 4 to 12 are views showing a manufacturing process of the LED unit 14. FIG. 4 shows a lead frame forming step, and FIG. 5 shows a support resin placing step. FIG. 6 shows a wiring forming step, and FIG. 7 shows a control part mounting step. FIG. 8 is a reference diagram showing wiring connection state after the control part mounting step. FIG. 9 shows an LED mounting step. FIGS. 10A and 10B are enlarged views of a portion B in FIG. 9. FIG. 11 shows a frame cutting step, and FIG. 12A shows a bending step. FIG. 12B shows an assembling step of assembling a completed circuit unit to the housing.

In the manufacturing of the LED unit 14, firstly, the lead frame forming step is executed. As shown in FIG. 4, in this step, a rectangular metallic board is punched to form a lead frame 68. However, the lead frame 68 in this state is a semi-finished product of the lead frame 52 and is supported stably on an outer frame 70 which is a portion remaining after punching. Namely, in this step, a frame substrate 73 is formed in which the outer frame 70 and the lead frame 68 are connected together via a plurality of connecting pieces 72.

The lead frame 68 has a terminal forming area 74 where the terminal portion 56 is to be formed, a first control part mounting area 76 where the first control part mounting portion 58 is to be formed, an LED mounting area 78 where the LED mounting portion 60 is to be formed, and a second control part mounting area 80 where the second control part mounting portion 62 is to be formed, and these areas are aligned sequentially in a longitudinal direction of the lead frame 68.

In this stage, on the LED mounting area 78, a bus bar 79a where the LED 24a is to be mounted, four bus bars 79b to 79e where the four LEDs 24b to 24e are to be mounted respectively, and a bus bar 79f which is to be connected to a ground line are formed in complete shapes. Hereinafter, the LEDs 24a to 24e will also be referred to as "LED 24s" collectively, and the bus bars 79a to 79f will also be referred to as "bus bars 79" collectively. On the other hand, general shapes of bus bars where the control parts 54 are to be mounted are formed on the control part mounting areas 76, 80. Further, at areas outside the LED mounting area 78, thin portions 82 for facilitating a bending processing described later are formed. When referred to here, although the "bus bar" means the "lead frame," as a matter of convenience, areas where electronic parts such as LEDs and control parts are mounted are referred to as the "bus bar."

On the other hand, the plurality of or three terminals 42 which make up the terminal portion 56 are formed in the terminal forming area 74. In the illustrated example, a GND terminal 42a which connects to the ground line, a feeding terminal 42b which supplies electric power to the LED 24a for a tail lamp and a feeding terminal 42c which supplies electric power to the LEDs 24b to 24e for a stop lamp are formed. The GND terminal 42a connects to the bus bar 79f, the feeding terminal 42b connects to the bus bar 79a, and the feeding terminal 42c connects to the bus bar 79b.

As shown in the figures, in relation to a width in a direction of the lead frame 68 which is at right angles to the longitudinal direction thereof, widths of the first control part mounting area 76 and the second control part mounting area 80 are made larger considerably than a width of the LED mounting area 78. As will be described later, this configuration will exhibit a high heat dissipating effect of dissipating heat from the control parts 54.

Following this, the support resin placing step is executed. As shown in FIG. 5, in this step, the frame substrate 73 is placed in a mold, not shown, and an insert molding using a resin material is executed. In this insert molding, the support resin 48 which holds the LED mounting area 78 in such a way as to cover most of the LED mounting area 78, the support resin 64 which holds the first control part mounting area 76 in such a way as to cover most of the first control part mounting area 76 and the support resin 66 which holds the second control part mounting area 80 in such a way as to cover most of the second control part mounting area 80 are formed integrally on the lead frame. In this embodiment, although these support resins 48, 64, 66 are made from polyphenylene sulfide (PPS), other resins may be adopted which include polybutylene terephthalate (PBT), polyamide and the like.

In this stage, the bus bar 79 is supported rigidly inwards of the support resin 48. On the other hand, the bus bar in the first control part mounting area 76 is supported stably by the support resin 64. As shown in the figure, a plurality of opening portions 84 where portions where to mount a control part on the first control part mounting area 76 are to be exposed and a plurality of opening portions 86 where an unnecessary wiring connecting portion is to be exposed are provided in a surface of the support resin 64.

Similarly, as shown in the figure a plurality of opening portions 88 where portions where to mount a control part on the second control part mounting area 80 are to be exposed and a cutout portion 89 and a plurality of opening portions 90 where an unnecessary wiring connecting portion is to be exposed are also provided in a surface of the support resin 66. The opening portions 86 in the support resin 64 and the opening portions 90 in the support resin 66 are provided to prevent the deformation of the lead frame 52 which would otherwise be produced in forming wirings, as will be described later.

Following this, the wiring forming step is executed. As shown in FIG. 6, in this step, unnecessary wiring connecting portions on the lead frame 68 are cut by making use of the opening portions 84, 86 in the support resin 64 and the opening portions 88, 90 in the support resin 66. As this occurs, a die prepared exclusively for cutting is used. This forms a wiring for a feeding circuit which connects the feeding terminal 42b and the GND terminal 42a and a wiring for a feeding circuit which connects the feeding terminal 42c and the GND terminal 42a. This also prevents the occurrence of short-circuit between the feeding terminals 42b, 42c. In this way, thin portions of the wiring connecting portions are cut in such a state that the lead frame 68 is held rigidly by the support resins 64, 66, and therefore, although the lead frame 68 is thin, the wirings can be formed on the lead frame 68 without deforming the lead frame 68 inadvertently.

Following this, the control part mounting step is executed. As shown in FIG. 7, in this step, control parts 54a to 54g are mounted on the first control part mounting area 76, and control parts 54h to 54t are mounted on the second control part mounting area 80. The control parts 54a to 54t will also be referred to as "control parts 54" collectively as required. Although these control parts 54 include electronic parts such as resistor elements, diodes, capacitors and the like in addition to IC chips which constitute a main control portion, a detailed description thereof will be omitted here. These control parts 54 are mounted by a reflow technique using soldering.

Namely, the control part mounting step includes a paste mounting step, a part mounting step and a reflow step. In the paste mounting step, using the opening portions 84 and 88, a solder paste is applied to mounting designation positions in the first control part mounting area 76 and the second control part mounting area 80. Following this, in the part mounting step, the control parts 54 are placed individually on the solder paste of the solder paste applied positions. Then, in the reflow step, the solder paste is heated to melt to form soldered joints where the control parts 54 are joined to the corresponding control part mounting areas.

As a matter of convenience in description, in FIG. 8, the support resins 48, 64, 66 shown in FIG. 7 are removed. As shown in the figure, after the control part mounting step is completed, the central bus bar 79a is connected to the feeding terminal 42b via the control parts 54d to 54g and the control part 54c at one end and is connected to the GND terminal 42a via the control parts 54a, 54b at the other end thereof. Additionally, one of the bus bars surrounding the central bus bar 79a, that is, the bus bar 79b is connected to the feeding terminal 42c via the control parts 54m to 54t and the control part 54j at one end and is connected to the GND terminal 42a via the control parts 54h, 54i at the other end thereof. Further, the bus bar 79f is connected to the GND terminal 42a. In this stage, although the bus bars 79c to 79e are in a partially rising state, the bus bars 70c to 79e are held integrally with the bus bars 79a, 79b, 79f by the support resins 48, 64, 66 in a stable fashion.

In this way, when the mounting of the control parts 54 is completed, washing is executed to remove dirt after the mounting of the control parts, whereafter the LED mounting step is executed. In this way, by executing the control part mounting step prior to the LED mounting step, the LEDs 24 can be protected. Namely, since the LEDs tend to easily be damaged by heat, it is not preferable that the LEDs are affected by heat produced by the reflow. In addition, in case the LEDs get dirty as a result of the reflow, there are fears that the light emitting performance of the LEDs 24 is deteriorated. Thus, the LED mounting step is executed after the control part mounting step.

As shown in FIG. 9, in the LED mounting step, the LEDs 24 are soldered to the portions where the bus bars 79 are placed. Namely, as shown in FIG. 10A, the LED 24a is mounted on the central bus bar 79a, and the LEDs 24b to 24e are mounted individually on the four bus bars 79b to 79e which surrounds the central bus bar 79a. As this occurs, the LEDs 24a to 24e are joined to the bus bars 79a to 79e in the form of a bare chip. The LED 24a for the tail lamp is connected to the feeding terminal 42b via the bus bar 79a at one end and is connected to the bus bar 79f for grounding via a lead wire L1 at the other end thereof.

On the other hand, the four LEDs 24b to 24e for the stop lamp are connected in series via lead wires L2 to L4 and the bus bars 79c to 79e. Namely, the LED 24b is connected to the LED 24c via the lead wire L2 and the bus bar 79c, the LED 24c is connected to the LED 24d via the lead wire L3 and the bus bar 79d, and the LED 24d is connected to the LED 24e via the lead wire L4 and the bus bar 79e. On the other hand, the LED 24b is connected to the feeding terminal 42c via the bus bar 79b, and the LED 24e is connected to the GND terminal 42a via a lead wire L5 and the bus bar 79f (refer to FIG. 9). Hereinafter, the lead wires L1 to L5 will also be referred to as "lead wires L" collectively.

The LED sealing step to protect the LEDs 24 is executed after the LED mounting step. As shown in FIG. 10B, the transparent resin 50 is filled inwards of the support resin 48. This sealing resin 50 is formed from a silicone resin. The sealing resin 50 is filled in an area surrounded by the support resin 48 in such a way as to cover the LEDs 24a to 24e and the lead wires L1 to L5 and is then set. In this case, the support resin 48 functions as a drip tray for the sealing resin 50. The sealing resin 50 also functions to prevent the intrusion of water into electrical connecting portions between the LEDs 24 and the lead wires L.

Following this, the frame cutting step is executed. As shown in FIG. 11, in this step, the connecting pieces 72 shown in FIG. 4 are cut, whereby the outer frame 70 and the lead frame 68 are separated. The lead frame 68 shown in FIG. 4 is then finished to be almost the lead frame 52 which takes the form of a product excluding the fact that the lead frame 68 needs to be bent. The terminal forming area 74 constitutes the terminal portion 56, the first control part mounting area 76 constitutes the first control part mounting portion 58, the LED mounting area 78 constitutes the LED mounting portion 60, and the second control part mounting area 80 constitutes the second control part mounting portion 62.

Following this, the bending step is executed. In this step, the lead frame 52 is bent at thin portions 82 functioning as shafts (hinges) from the state shown in FIG. 11. The lead frame 52 is bent to a back side of the LEDs 24 at right angles at both sides of the LED mounting portion 60. Further, the terminal portion 56 is bent outwards at right angles from a connecting portion with the support resin 64 which constitutes a boundary between the terminal portion 56 and the support resin 64. By bending the lead frame 52 in the way described above, a light source circuit unit 92 shown in FIG. 12A is formed. In this state, as shown in the figure, the control parts 54 are exposed to an external surface side of the lead frame 52.

Following this, the assembling step of assembling the light source circuit unit 92 to the housing will be described. In this step, the light source circuit unit 92 and the housing 30 are integrated with each other by the insert molding of the resin material which is a raw material of the housing 30. A mold for injection molding is used in this insert molding. The LED unit 14 is completed at the end of this step as shown in FIG. 12B. In this state, the first control part mounting portion 58 and the second control part mounting portion 62 are embedded in the housing 30.

As shown in FIG. 12A, in relation to a width in a direction of the lead frame 52 which is at right angles to the longitudinal direction thereof, widths of the first control part mounting portion 58 and the second control part mounting portion 62 are made larger considerably than a width of the LED mounting portion 60. This allows heat generated in the LEDs 24 and the control parts 54 is transmitted efficiently to the housing 30 via the control part mounting portions 58, 62 to be dissipated therefrom. This contributes to a long life of the LED unit 14.

Thus, as has been described heretofore, in this embodiment, the support resin 48 is formed integrally so as to surround the LED mounting area 78 prior to bending the lead frame 52. Then, the lead frame 52 is bent at areas outside the support resin 48. Namely, the LED mounting area 78 on the lead frame 52 is supported rigidly inwards of the support resin 48, while due to the bent portions being present outwards of the support resin 48, it is difficult for tensile stress to be applied to the LEDs 24 and the peripheries thereof in the bending step. As a result, it is possible to prevent effectively the rapture of the LEDs 24 and joint portions thereof to the LED mounting area 78 which would otherwise be triggered by the bending of the lead frame 52.

In addition, the lead frame 52 is bent at both the sides of the LED mounting portion 60 so that the control part mounting portions 58, 62 are separated from each other at the bent portions as boundaries, whereby the LEDs 24 and the control parts 54 are disposed in the different areas which are bounded by the bent portions so as to be spaced away from each other. Additionally, the widths of the control parts mounting portions 58, 62 are made large, and therefore, not only do the control part mounting portions 58, 62 themselves have a large heat dissipating effect, but also heat generated by the control parts 54 mounted thereon is easily released to the housing 30 by way of the control part mounting portions 58, 62. This enables heat generated by the control parts 54 to be dissipated efficiently, as a result of which the LEDs 24 can be protected from heat.

Thus, while the invention has been described heretofore by reference to the embodiment, the invention is not limited to the embodiment. Arbitrary combinations or substitutions of the configurations of the embodiment are also included in the invention. Additionally, it is also possible to change the combinations or the order of the manufacturing steps of the embodiment as required based on the knowledge of those skilled in the art to which the invention pertains. It is also possible to make modifications such as design changes and the like to the embodiment. The resulting embodiments from those changes or modifications can also be included in the scope of the invention.

Modified Example 1

Figure 13:
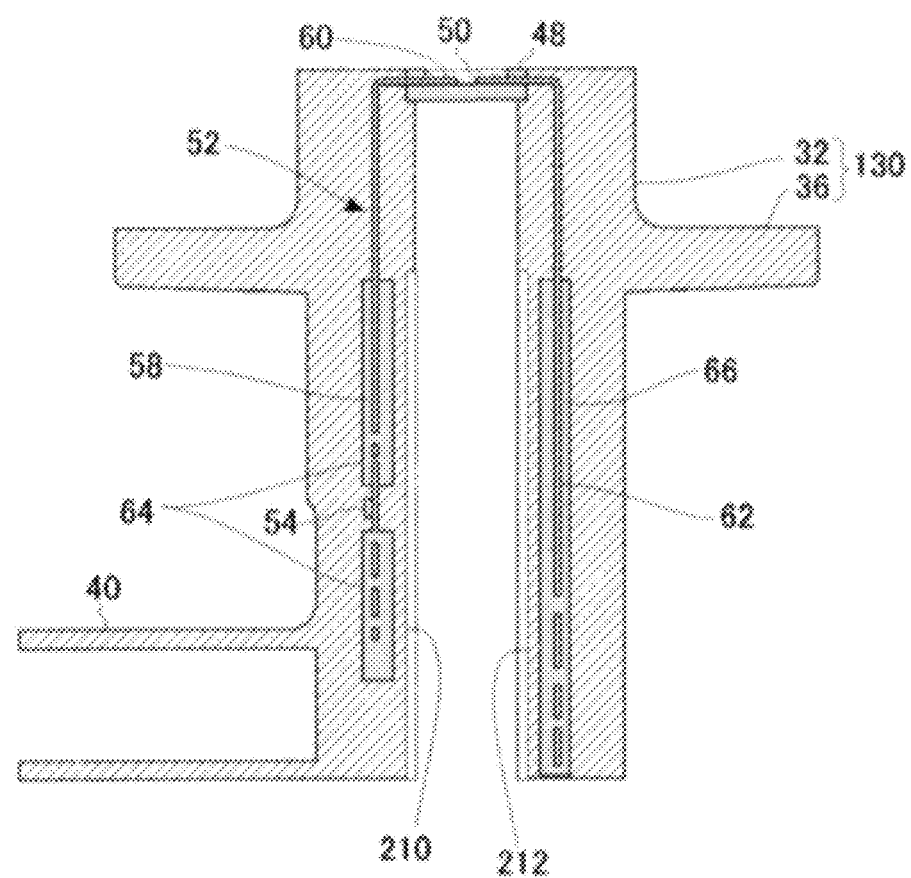
FIG. 13 is a sectional view of an LED unit according to a modified example.

FIG. 13 is a sectional view of an LED unit according to a modified example. FIG. 13 corresponds to FIG. 3B. In this modified example, heat dissipating grooves 210 are formed on an inner surface of a portion of a housing 130 where a first control part mounting portion 58 is embedded so as to extend along a longitudinal direction of the first control part mounting portion 58. Similarly, heat dissipating grooves 212 are formed on an inner surface of a portion of the housing 130 where a second control part mounting portion 62 is embedded so as to extend along a longitudinal direction of the second control part mounting portion 62. In this modified example, although the pluralities of grooves 210, 212 are provided parallel (with only one groove of each of the pluralities of grooves shown in the figure), only a single groove may be provided on each of the inner surfaces. Thus, ribs can be formed also on the inner surface side of the housing 30 by providing the grooves in the way described above, thereby making it possible to enhance the heat dissipating effect. The shapes and positions of the grooves 210, 212 may differ from each other according to the difference in position of the control parts 54 in the control part mounting portions 58, 62.

Modified Example 2

Figure 14A:
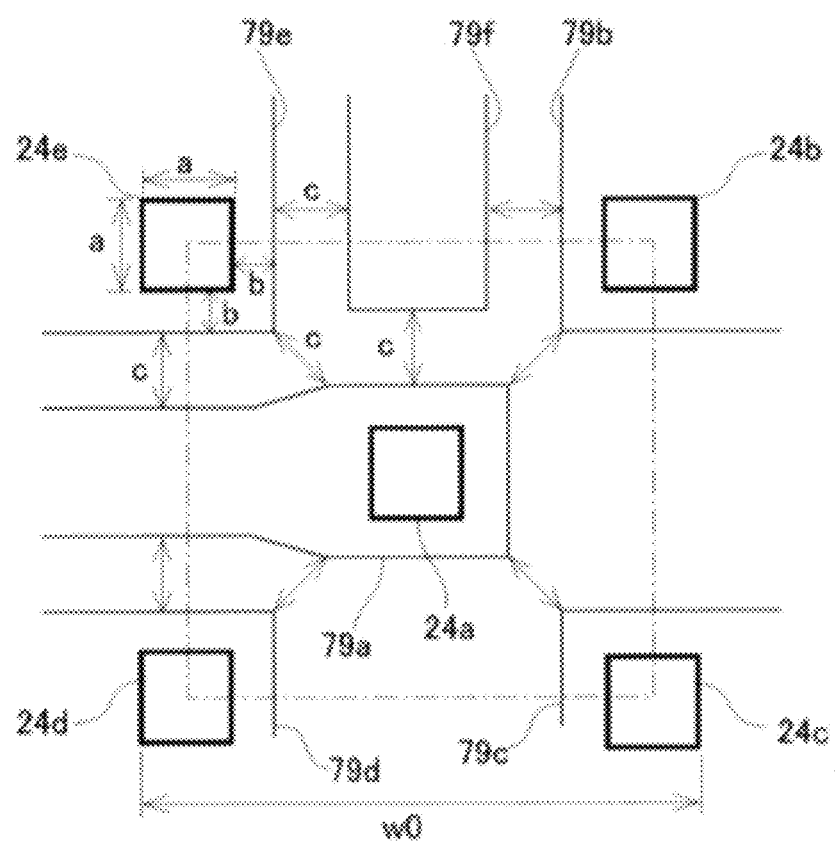
FIGS. 14A and 14B show enlarged views showing an arrangement of LEDs and peripheries of the LEDs in LED units according to other modified examples.
Figure 14B:
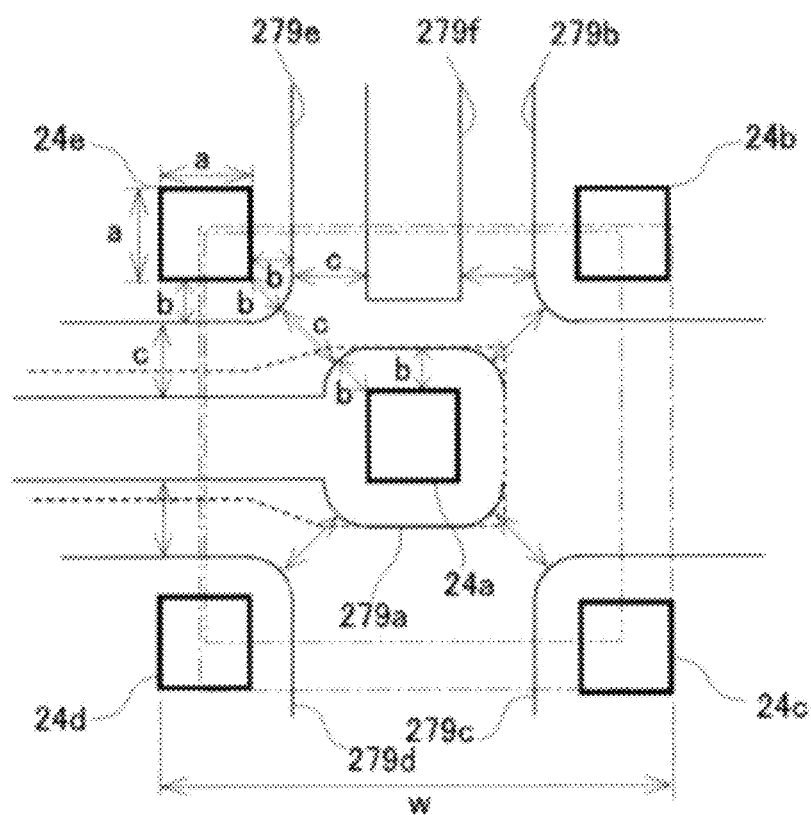

FIGS. 14A and 14B show enlarged views showing positional configurations on the peripheries of LEDs of an LED unit according to another modified example. FIG. 14A shows positional configurations of the embodiment described above, and FIG. 14B shows positional configurations of this modified example. In this modified example, by devising the shapes of bus bars where LEDs 24 are mounted, the LEDs 24 can be mounted closer to each other.

Namely, as shown in FIG. 14A, in the embodiment described above, the bus bars 79b to 79e are disposed about the bus bar 79a, and further, the bus bar 79f for grounding is disposed (refer to FIGS. 10A and 10B). Additionally, the LEDs 24a to 24e are described as being mounted individually on the bus bars 79a to 79e. In mounting the LEDs 24 in this way, in general, there are limitations as below. Namely, a minimum clearance b needs to be provided between an edge of the bus bar 79 where the LED 24 is mounted and one side of the LED 24, and a minimum clearance c needs to be provided between the adjacent bus bars 79. The former minimum clearance b is intended to ensure the mounting performance in mounting the LED 24 by the reflow technique using solder. Namely, the clearance is intended to prevent the solder which melts as a result of reflow from falling from the bus bar 79 to cause short-circuit. On the other hand, the latter minimum clearance c is based on the dimensions of a die or the like by which the bus bars 79 are punched out from a metallic board, and here, the clearance c is almost equal to the thickness of the bus bar 79.

On the other hand, in arranging a plurality of LEDs 24 as shown in the figure, when the common lens is used as shown in FIG. 1, it is desirable that the LEDs 24 are disposed as close to each other as possible. This is because the optical axes of the LEDs 24 are made to lie as close to each other as possible so as to enhance the emission performance. Then, in this modified example, the shapes and positions of bus bars 279 (279a to 279f) shown in FIG. 14B are adopted. Here, the LEDs 24 are bare chips and are each formed into a square each side of which is a.

Namely, corner portions of the adjacent bus bars 279 which lie on a line which connects the LEDs 24 mounted on the bus bars 279 are rounded. A radius of the rounded shape coincides with the minimum clearance b. By adopting this configuration, the adjacent bus bars 279 can be made to lie close to each other while ensuring the minimum clearances b, c which are described above, as a result of which the plurality of LEDs 24 can be made to lie closed to each other (refer to an alternate long and short dash line and a chain double-dashed line in the figure). In the positional configurations of the five LEDs 24 shown in the figure, the LEDs 24 can be laid within a mounting range expressed by $w=3a+(4/\sqrt{2})b+(2/\sqrt{2})c$. The mounting range shown in FIG. 14A is expressed by $w0=3a+4b+(2/\sqrt{2})c$. Therefore, according to the modified example, compared with the mounting range of the embodiment described above, the mounting range can be reduced by $(4-2/\sqrt{2})b$, thereby making it possible to enhance the emission performance.

Modified Example 3

Figure 15A:
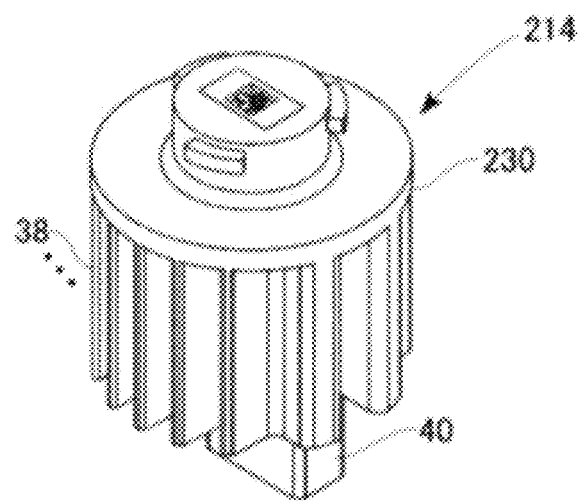
FIGS. 15A to 15C show views showing the configuration of an LED unit according to a further modified example.
Figure 15B:
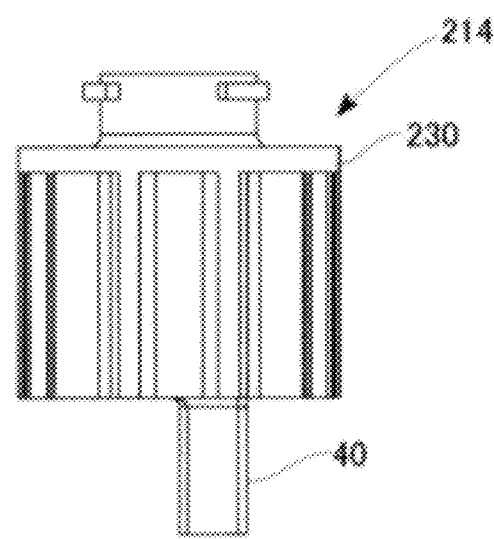
Figure 15C:
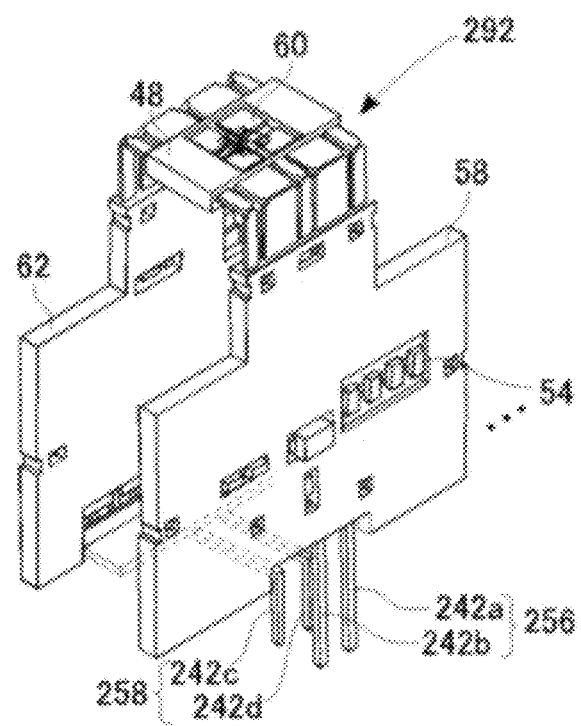

FIGS. 15A to 15C show views showing the configuration of an LED unit according to a further modified example. FIG. 15A is a perspective view, and FIG. 15B is a bottom view of the LED unit. FIG. 15C is a perspective view of a light source circuit unit. As shown in FIGS. 15A and 15B, an LED unit 214 of this modified example is provided so that a connector 40 is parallel to an axis of a housing 230.

Additionally, as shown in FIG. 15C, terminal portions 256 and 258 are provided individually at both ends of a light source circuit unit 292. The terminal portion 256 extends from a first control part mounting portion 58, and the terminal portion 258 extends from a second control part mounting portion 62. The terminal portion 256 has a feeding terminal 242b which connects to an LED 24a and a GND terminal 242a which connects to a ground line. On the other hand, the terminal portion 258 has a feeding terminal 242c which connects to LEDs 24b to 24e and the GND terminal 242d which connects to a ground line.

The terminal portion 256 extends towards an opposite side to a side where an LED mounting portion 60 is provided along a plane on which the first control part mounting portion 58 extends. On the other hand, the terminal portion 258 is bent from the second control part mounting portion 62 towards the first control part mounting portion 58 at right angles and is bent further at right angles at a distal end portion so as to be parallel to the terminal portion 256. In this modified example, too, since a step of surrounding the LED mounting portion 60 with a support resin 48 is executed, the same working effect as that of the embodiment can also be obtained.

Modified Example 4

Figure 16A:
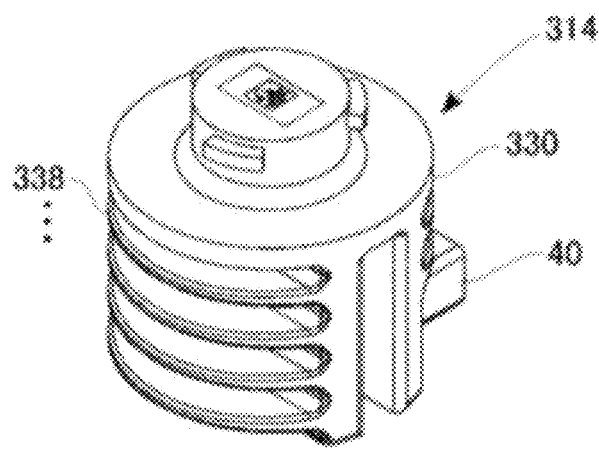
FIGS. 16A to 16C show views showing the configuration of an LED unit according to a modified example.
Figure 16B:
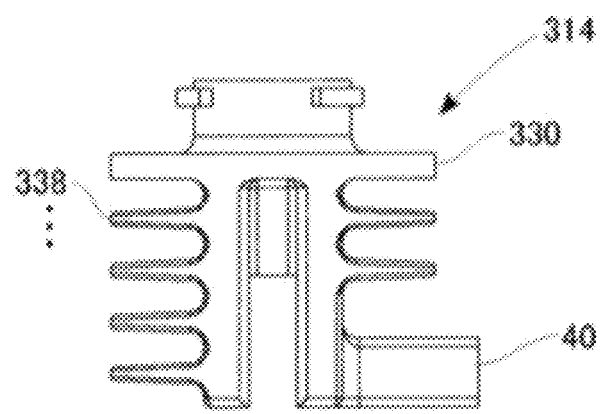
Figure 16C:
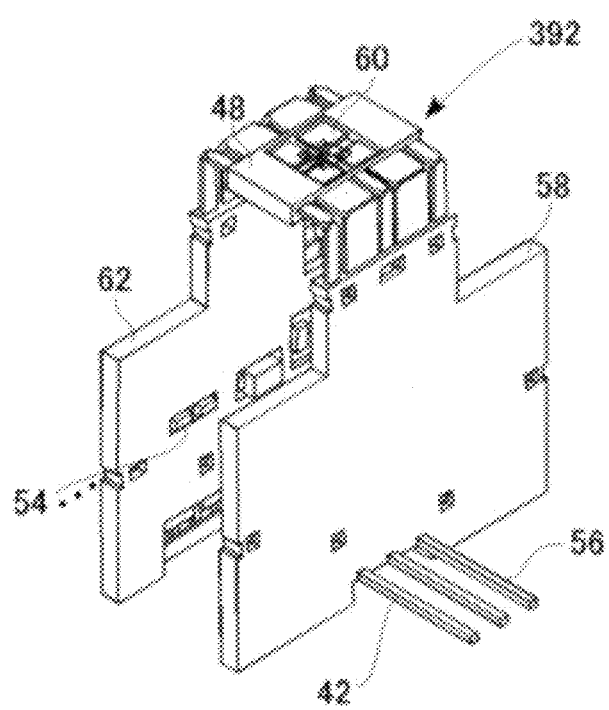

FIGS. 16A to 16C show views showing the configuration of an LED unit according to an another modified example. FIG. 16A is a perspective view, and FIG. 16B is a bottom view of the LED unit. FIG. 16C is a perspective view of a light source circuit unit. As shown in FIGS. 16A and 16B, an LED unit 314 of this modified example has a plurality of ribs 338 which extend on a circumferential portion of a housing 330 in a direction which is at right angles to an axis thereof. The plurality of ribs 338 are parallel to each other.

In addition, as shown in FIG. 16C, control parts 54 are mounted not on an external surface side but on an internal surface side of a light source circuit unit 392 at a first control part mounting portion 58 and a second control part mounting portion 62. Namely, as shown in FIG. 11, a mounting surface of the LEDs 24 and mounting surfaces where the control parts 54 are mounted are positioned on opposite sides of a lead frame 52 in a deployed state resulting prior to the lead frame 52 being bent. In this modified example, too, since a step of surrounding the LED mounting portion 60 with a support resin 48 is executed, the same working effect as that of the embodiment described above can also be obtained. In addition, according to this modified example, a space held between the first control part mounting portion 58 and the second control part mounting portion 62 therebetween can be made effective use of as a mounting area for the control parts 54, and the housing 330 can be made compact in size.

Embodiment 5

In the embodiment described above, as shown in FIGS. 10A, 10B, 12A, and 12B, the five LEDs 24 provided on the LED mounting portion 60 are described as being disposed in the specific positions. In this modified example, however, either or both of the shape and number of LEDs 24 may be changed. Only one LED 24 may be disposed.

Modified Example 6

In the embodiment described above, the LEDs 24 are described as being mounted on the lead frame 52 in the form of a bare chip. However, LEDs 24 may be configured as packaged chips which are each sealed in a plastic package for mounting on a lead frame 52. In addition, in place of the lead frame, other boards such as a printed circuit board (PCB), a flexible printed circuit board (FPC) and the like may be adopted so that LEDs 24 are mounted thereon.

Modified Example 7

In the embodiment described above, as shown in FIG. 1, the LED unit 14 is described as being assembled to the lamp body 12 by making use of the fitting construction. However, in this modified example, other attaching constructions like one using a screw mechanism or the like may be adopted.

Modified Example 8

In the embodiment described above, as shown in FIG. 5, the support resins 48, 64, 66 are described as being insert molded on the lead frame 68. However, in this modified example, a configuration may be adopted in which at least anyone of support resins is prepared separately from a lead frame 68, so that the support resin so prepared is assembled to the lead frame 68 through fitting prior to the bending step.

Modified Example 9

In the embodiment described above, in the control part mounting step, the solder paste is described as being applied to the lead frame 68 for reflow. In the modified example, however, a metal paste of brazing material other than solder may be adopted.

Modified Example 10

In the embodiment described above, as shown in FIG. 1, the inner lens 16 is described as being assembled to the lamp body 12 independently of the LED unit 14. In this modified example, however, a configuration may be adopted in which an inner lens 16 and an LED unit 14 are made detachable, so that the inner lens 16 and the LED unit 14 can be fixed to wall surfaces of a lamp body 12 in such a way as to hold the wall surfaces therebetween. Alternatively, a configuration may be adopted in which an inner lens 16 is made small in size so as to be provided integrally with an LED unit 14 for assemblage to a lamp body 12.

Modified Example 11

In the embodiment above, the LED unit is described as being applied to the tail and stop combination lamp. In this modified example, however, an LED unit may be applied to a rear combination lamp which includes a tail lamp, a stop lamp, a turn indicator lamp and a back-up lamp or to anyone of them. Alternatively, the LED unit may be applied to a headlamp. Namely, the configuration and manufacturing method described above may be applied to LED units of those lamps.

Modified Example 12

In the embodiment described above, in the lead frame forming step, the lead frame is described as being formed by punching the metallic board. In this modified example, however, a lead frame may be formed by working a metallic board with a laser beam or through etching.

Modified Example 13

Figure 17:
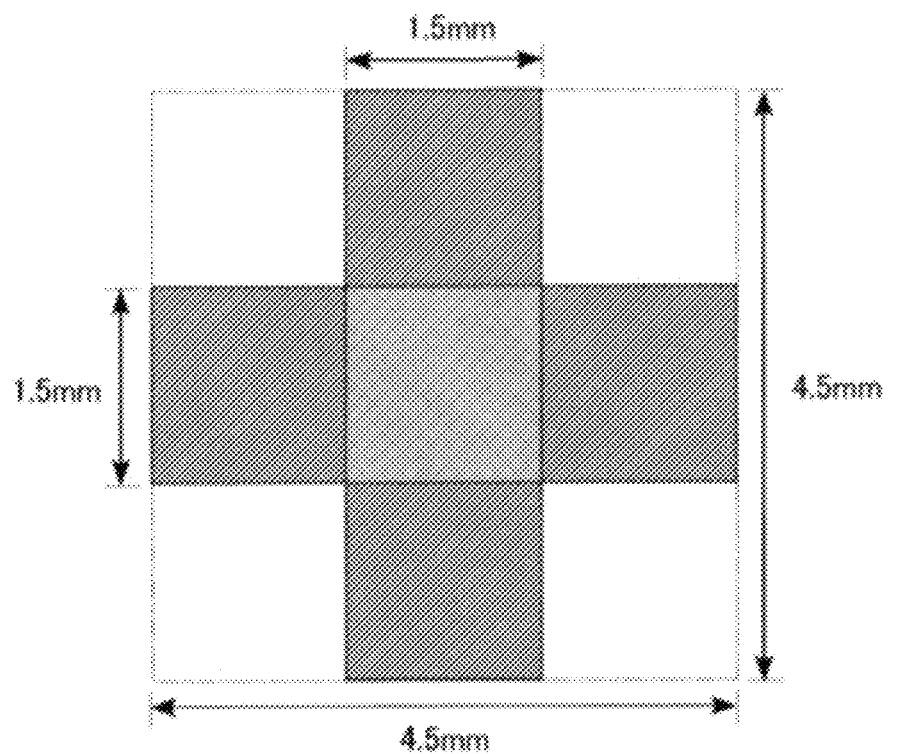
FIG. 17 shows the configuration of an LED unit according to another modified example.

Although this is not described in the embodiment above, in case the LED unit is configured as the tail and stop combination lamp, the disposition ranges (the light emitting ranges) of a tail lamp and a stop lamp may be determined so as to fall within specific ranges. FIG. 17 is a view showing the configuration of an LED unit according to a further modified example. Namely, as shown in the figure, a light source mounting range falls in a 4.5-mm square, and an area of 1.5-mm square is provided in the center of the light source mounting range of 4.5-mm square as a light emitting range of an LED for the tail lamp. Additionally, an area of 1.5-mm square is provided on each of four up, down, left and right sides of the central area of 1.5-mm square to constitute a light emitting range for each of LEDs for the stop lamp.

The invention is not limited to the embodiment or to the modified examples and hence can be embodied by modifying the constituent elements without departing from the spirit and scope of the invention. The plurality of constituent elements disclosed in the embodiment and the modified examples may be combined as required to form various inventions. Alternatively, some constituent elements may be omitted from all the constituent elements disclosed in the embodiment and modified examples.

The invention claimed is:
1. A manufacturing method of an LED unit which is made by assembling an LED and a control part configured to control the illumination of the LED integrally on a housing made of resin, comprising:
  forming a lead frame having a first surface and a second surface opposite to the first surface and comprising:
    a terminal forming area comprising a terminal portion configured to connect with an exterior terminal;
    an LED mounting area where the LED is mounted on the first surface of the lead frame; and
    a control part mounting area where a control part is to be mounted, the terminal forming area, the LED mounting area and the control part mounting area integrally connected to one another;
  placing a support resin on the first surface of lead frame to surround the LED mounting area, the support resin being a resin material, the support resin including a groove, the groove exposing the LED mounting area surrounded by the support resin;
  mounting the LED on the LED mounting area;
  mounting the control part on the control part mounting area;
  bending the lead frame to a back side thereof at areas outside the support resin;
  assembling the bent lead frame to the housing; and
  filling a transparent sealing resin inwards in the groove of the support resin to cover the LED and lead wires after the mounting the LED,
  wherein the mounting the LED is performed after covering at least a portion of the LED mounting area,
  wherein the control part mounting area comprises a first control part mounting area and a second control part mounting area, the LED mounting area provided between the first and the second control part mounting areas along a length-wise direction of the lead frame,
  wherein the bending comprises bending the first control part mounting area and the second control part mounting area with respect to the LED mounting area, and
  wherein the first and the second control part mounting areas extending in a direction parallel with each other.
2. The LED unit manufacturing method according to claim 1, wherein
  the mounting the control part comprises:
  mounting a metal paste on the control part mounting area;
  mounting the control part on the metal paste; and
  melting the metal paste to join the mounted control part to the control part mounting area.
3. The LED unit manufacturing method according to claim 1, wherein in the assembling, the bent lead frame and the housing are formed integrally by an insert molding, the housing made with a resin material.
4. The LED unit manufacturing method according to claim 1, wherein in the placing the support resin, the lead frame and the support resin are formed integrally by an insert molding of the resin material onto the lead frame.
5. The LED unit manufacturing method according to claim 1, wherein the support resin surrounds the first surface of the lead frame in a thickness direction of the lead frame.
6. The LED unit manufacturing method according to claim 1, wherein a width of the control part mounting area is greater than a width of the LED mounting area.
7. The LED unit manufacturing method according to claim 1, wherein the mounting the control part is performed before the mounting the LED.
8. The LED unit manufacturing method according to claim 1, wherein in the placing, the support resin is placed on the first and second surfaces of the lead frame.
9. An LED unit which functions as a light source of a vehicle lamp, comprising:
  a resin housing detachably assembled to a vehicle lamp;
  a lead frame having a first surface and a second surface opposite to the first surface and comprising:
    a terminal portion connected to an exterior terminal;
    an LED mounting portion;
    a control part mounting portion and which is provided integrally on the housing; and a support resin provided on the first surface of the lead frame to surround the LED mounting portion, the support resin made with a resin material and including a groove, the groove exposing the LED mounting portion surrounded by the support resin;

an LED mounted on the first surface of the lead frame at the LED mounting portion; and a control part mounted on the control part mounting portion and configured to control the illumination of the LED; and a transparent sealing resin configured to be filled inwards of the groove of the support resin, the transparent sealing resin covering the LED and lead wires, wherein the lead frame further comprises bent portions bent to a back side of the LED at areas outside the support resin, wherein the control part mounting portion and the terminal portion correspond to the bent portions, wherein the control part mounting portion comprises a first control part mounting portion and a second control part mounting portion, the LED mounting portion provided between the first and the second control part mounting portions along a length-wise direction of the lead frame;

wherein the first and the second control part mounting portions are bent with respect to the LED mounting portion, and wherein the first and the second control part mounting portions extending in a direction parallel with each other.

10. The LED unit according to claim 9, wherein the support resin surrounds the first surface of the lead frame in a thickness direction of the lead frame.

11. The LED unit according to claim 9, wherein a width of the control part mounting portion is greater than a width of the LED mounting portion.

12. The LED unit according to claim 9, wherein the support resin is placed on the first and second surfaces of the lead frame.

* * * * *